(12) United States Patent
Nuebling

(10) Patent No.: US 7,304,525 B2
(45) Date of Patent: Dec. 4, 2007

(54) LEVEL CONVERTER

(75) Inventor: Marcus Nuebling, Esting (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/302,752

(22) Filed: Dec. 14, 2005

(65) Prior Publication Data

US 2006/0197578 A1 Sep. 7, 2006

(30) Foreign Application Priority Data

Dec. 14, 2004 (DE) ............ 10 2004 060 212

(51) Int. Cl.
  *H03L 5/00* (2006.01)
(52) U.S. Cl. .................... 327/333; 326/80
(58) Field of Classification Search ........ 327/331–333, 327/50, 77; 326/62, 80, 81
See application file for complete search history.

(56) References Cited

U.S. PATENT DOCUMENTS

| | | | | |
|---|---|---|---|---|
| 5,528,172 | A * | 6/1996 | Sundstrom | 326/80 |
| 5,808,501 | A * | 9/1998 | Ivanov | 327/333 |
| 6,292,031 | B1 * | 9/2001 | Thompson et al. | 327/66 |
| 6,340,911 | B1 * | 1/2002 | Kanno | 327/333 |
| 6,433,611 | B1 * | 8/2002 | Foroudi et al. | 327/333 |
| 6,437,628 | B1 * | 8/2002 | Davenport et al. | 327/333 |
| 6,963,238 | B2 * | 11/2005 | Mochizuki | 327/333 |
| 7,049,876 | B2 * | 5/2006 | Heaston | 327/333 |
| 7,075,335 | B2 * | 7/2006 | Chin et al. | 326/68 |

FOREIGN PATENT DOCUMENTS

DE   196 54 221   6/1998

OTHER PUBLICATIONS

IR2171/IR2172 (S), International Rectifier, Jan. 27, 2004.
AEG-Hilfsbuch, 8. Auflage, Berlin-Grunewald, 1960, Verlag W. Giradet, Essen, S. 4/17.

* cited by examiner

*Primary Examiner*—Kenneth B. Wells
*Assistant Examiner*—Hai L. Nguyen
(74) *Attorney, Agent, or Firm*—Dicke, Billig & Czaja PLLC

(57) ABSTRACT

A level converter is disclosed. In one embodiment, the level converter includes a first and second input for applying a first voltage and first and second output terminals for providing a second voltage, a first RC element, and a second RC element, and a first controlled current source arrangement and a second controlled current source arrangement. A control signal generating circuit is provided that generates a control signal for the first and second current source arrangements and has at least one differential amplifier arrangement which is designed to compare a potential at least one of the outputs with a reference potential and to generate a differential signal on which the control signal is dependent.

21 Claims, 6 Drawing Sheets

LEVEL CONVERTER

CROSS-REFERENCE TO RELATED APPLICATIONS

This Utility Patent Application claims priority to German Patent Application No. DE 10 2004 060 212.3-35 filed on Dec. 14, 2004, which is incorporated herein by reference.

FIELD OF THE INVENTION

The present invention relates to a level converter (e.g., level shifter).

BACKGROUND

Level converters are used, in a known manner, to convert a first voltage which is based on a first potential to a second voltage which has the same magnitude and is based on a second potential. Level converters are used, for example, if the first voltage, on account of the first potential on which it is based, is outside the operating range of a signal processing circuit which is intended to process the voltage further.

FIG. 1 illustrates one application of such a level converter and one example of a known level converter. This figure illustrates an inductance-exhibiting load 100, one connection of which is at a reference-ground potential GND and the other connection of which is selectively connected to a supply potential V+ or reference-ground potential GND via a half-bridge which comprises two switches SW1, SW2. Arrangements of this type are found, for example, in switching converters or in electric motors, the inductive load representing one of a plurality of motor windings in the last-mentioned case.

In order to detect a current flowing through the load, a measuring resistor (shunt resistor) Rs is connected in series with the load L, a current flowing through the load giving rise to a voltage drop Vin across said measuring resistor, which voltage drop is intended to be processed further by a measuring amplifier OPV in order to determine the current flowing through the load. This voltage Vin is based on a potential at the node which is common to the load L and the measuring resistor Rs. This potential varies on the basis of the switching state of a first and a second switch SW1 and SW2 and corresponds approximately to the supply potential V+ when the first switch SW1 is closed and the second switch SW2 is open.

Assuming that this voltage Vin is outside the operating range of the measuring amplifier OPV, it is necessary to convert this voltage to a voltage Vout which has the same magnitude and is based on a lower potential.

To this end, the known level converter comprises two identically dimensioned series circuits each having a resistor R10, R20 and a current source Iq10, Iq20, which are each connected between the terminals 110, 210, between which the first voltage Vin is applied, and reference-ground potential GND. In this case, the second voltage can be tapped off between the nodes which are respectively common to the resistor R10, R20 and the current source Iq10, Iq20 of a series circuit. In comparison with the first voltage Vin, the second voltage Vout is based on a lower potential which is below the potential at the node 110 by the value of a voltage drop V10 across the resistor R10. This voltage drop is prescribed by the resistance of the resistor R10 and the current provided by the current source Iq10 which is connected in series with said resistor R10.

The disadvantage of this level converter is that the potential on which the second voltage Vout is based fluctuates to the same extent as the potential on which the first voltage Vin is based. The so-called "common mode range" defines the range within which the potential on which the first voltage is based changes. In the case of the known level converter, this common mode range must not be greater than the operating range of the downstream amplifier OPV. The known converter operates in a comparatively inaccurate manner on account of production-dictated or temperature-dictated fluctuations in the resistances of the resistors R10, R20. This is problematic, in particular, when the common mode component of the first voltage Vin is large in comparison with the first voltage Vin, that is to say when the potential on which the first voltage Vin is based is considerably larger than the first voltage Vin itself. Conventional ratios between the common mode component and the useful component, i.e. the first voltage Vin in the example explained above, may be between 100 and 1000.

The data sheet IR2171/IR2172 (S), International Rectifier, Jan. 27, 2004, describes an integrated module which uses a measuring resistor that is connected in series with a motor winding to convert a voltage to a pulse-width-modulated signal based on a reference-ground potential. In this case, the pulse width of the signal obtained contains the information about the magnitude of the measurement voltage across the measuring resistor. However, this circuit can be implemented only with a high outlay. For these and other reasons, there is a need for the present invention.

SUMMARY

The present invention provides a level converter is disclosed. In one embodiment, the level converter includes a first and second input for applying a first voltage and first and second output terminals for providing a second voltage, a first RC element, and a second RC element, and a first controlled current source arrangement and a second controlled current source arrangement. A control signal generating circuit is provided that generates a control signal for the first and second current source arrangements and has at least one differential amplifier arrangement which is designed to compare a potential at least one of the outputs with a reference potential and to generate a differential signal on which the control signal is dependent.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

In the figures, unless specified otherwise, identical reference symbols denote identical circuit components and signals with the same meaning.

DETAILED DESCRIPTION

Figure 1:
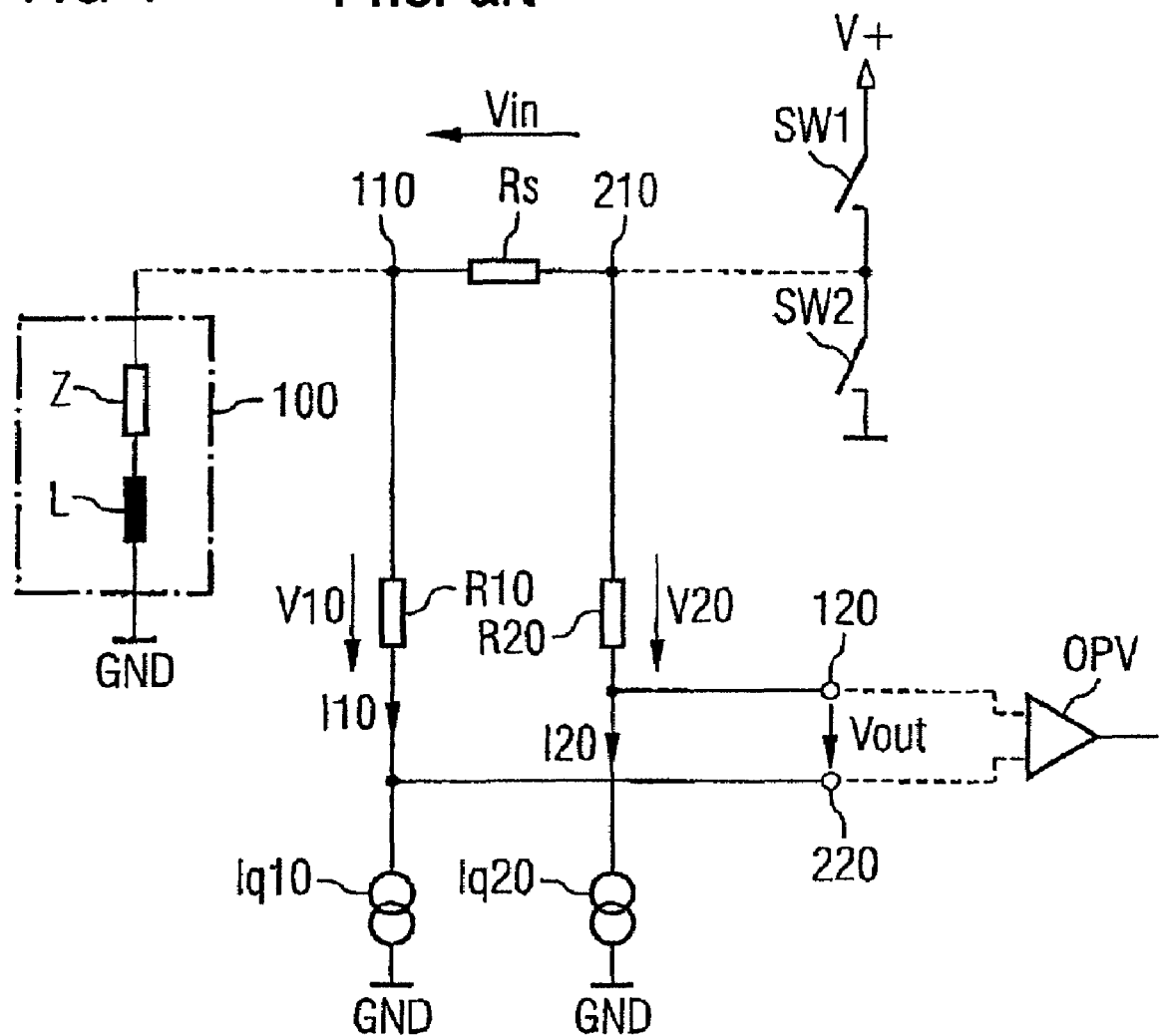
FIG. 1 illustrates a level converter in accordance with the prior art as well as an exemplary application of such a level converter.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a level converter which is capable of converting a first voltage for a wide common mode range to a second voltage with a reduced common mode range and which can be implemented in a simple manner.

In one embodiment, the level converter has first and second input terminals for applying a first voltage and first and second output terminals for providing a second voltage. The level converter also includes a first RC element having an input, which is connected to the first input terminal, and having an output, which is connected to the first output terminal, and a second RC element having an input, which is connected to the second input terminal, and having an output, which is connected to the second output terminal, as well as a first controlled current source arrangement and a second controlled current source arrangement, one of which is connected, at least at times, to the first output terminal and the other of which is connected, at least at times, to the second output terminal. In this embodiment, a control signal generating circuit generates a control signal for the first and second current source arrangements. This control signal generating circuit has at least one differential amplifier arrangement which is designed to compare a potential at least one of the output terminals with a reference potential and to generate a differential signal which is dependent on a difference between these potentials. In this embodiment, the control signal generating circuit generates the control signal on the basis of this differential signal.

In this embodiment, the RC elements are first-order RC elements and, moreover, are dimensioned identically. In addition, the first and second current source arrangements are preferably dimensioned identically.

In one embodiment of the level converter according to the invention, the control signal generating circuit having the at least one differential amplifier arrangement is used to drive the current source arrangements in such a manner that the potential at the at least one output to which the differential amplifier arrangement is connected follows the reference potential. When the RC elements are dimensioned identically and the current source arrangements are dimensioned identically, this results in an identical voltage drop between the first input terminal and the first output terminal as well as between the second input terminal and the second output terminal. The magnitude of the second voltage which can be tapped off between the output terminals and forms the output voltage of the level converter then corresponds to that of the first voltage which forms the input voltage of the level converter. This output voltage is based on the potential at one of the outputs, which potential is set on the basis of the reference voltage and is independent of the potential on which the first voltage (which is supplied to the level converter) is based. In the case of this level converter, changes in the common mode level of the first voltage, that is to say those changes in the case of which the potentials at the inputs of the level converter change to the same extent, thus have no influence on the common mode level of the second voltage. The level converter is thus particularly suited to converting input voltages having a wide common mode fluctuation range.

In one exemplary embodiment, the control signal generating circuit includes a first differential amplifier arrangement which is designed to compare a potential at the first output with the reference potential and to generate a first differential signal, and a second differential amplifier arrangement which is designed to compare a potential at the second output with the reference potential and to generate a second differential signal. In this embodiment, the first and second differential signals are supplied to a signal combination circuit which uses these two differential signals to provide the control signal which jointly drives the two current source circuits. In this embodiment, the magnitude of the second voltage between the output terminals likewise corresponds to that of the first voltage. In this embodiment, the potentials at the output terminals are set in such a manner that the potential at one of the output terminals is below the reference potential by half of the second voltage, while the potential at the other output terminal is above the reference potential by half of the second voltage.

On account of the low-pass character of the two RC elements, sudden changes in the potentials at the input terminals are forwarded to the output terminals in a retarded manner, with the result that the control signal generating circuit and the connected current source arrangements can be used to effectively compensate for these changes without severe common mode fluctuations occurring in the second voltage.

The reaction behavior of the level converter in the case of common mode fluctuations in the first voltage can be improved by the control circuit generating an input potential signal which is dependent on the potential at one of the input terminals, and by the control circuit generating the control signal on the basis of this input potential signal and the at least one differential signal. In this embodiment, changes in the potential at this one input terminal lead directly to a change in the signal that drives the current source arrangements, even before a change (to which the differential amplifier arrangement can react by changing the control signal) occurs in the potential at the associated output terminal. Feed forward is implemented by means of the direct influence of the potential at one of the input terminals on the control signal that sets the potential at the output terminals.

In one embodiment of a level converter according to the invention, the potential difference between the first input terminal and the first output terminal as well as between the second input terminal and the second output terminal is determined by the current consumption of the two current source arrangements and the properties of the RC elements. Under ideal conditions, i.e., when the first and second RC elements have absolutely identical properties and when the first and second current source arrangements have absolutely identical properties, these potential differences are identical. Since production-dictated discrepancies in the properties of these components cannot usually be completely avoided, another embodiment provides for a "chopper arrangement" to be connected between the current source arrangements and the output terminals of the level converter. This chopper arrangement is designed to respectively alternately connect the current source arrangements to the first and second output terminals in time with a chopper signal. In this embodiment, the chopper frequency is preferably considerably higher than the frequency at which changes occur in the first voltage which is to be converted. Discrepancies between a first current provided by the first current source arrangement and a second current provided by the second current source arrangement (which discrepancies can occur due to the dictates of production despite the current source arrangements being driven in an identical manner) are averaged out by changing over the current source arrangements in a clocked manner.

Figure 2:
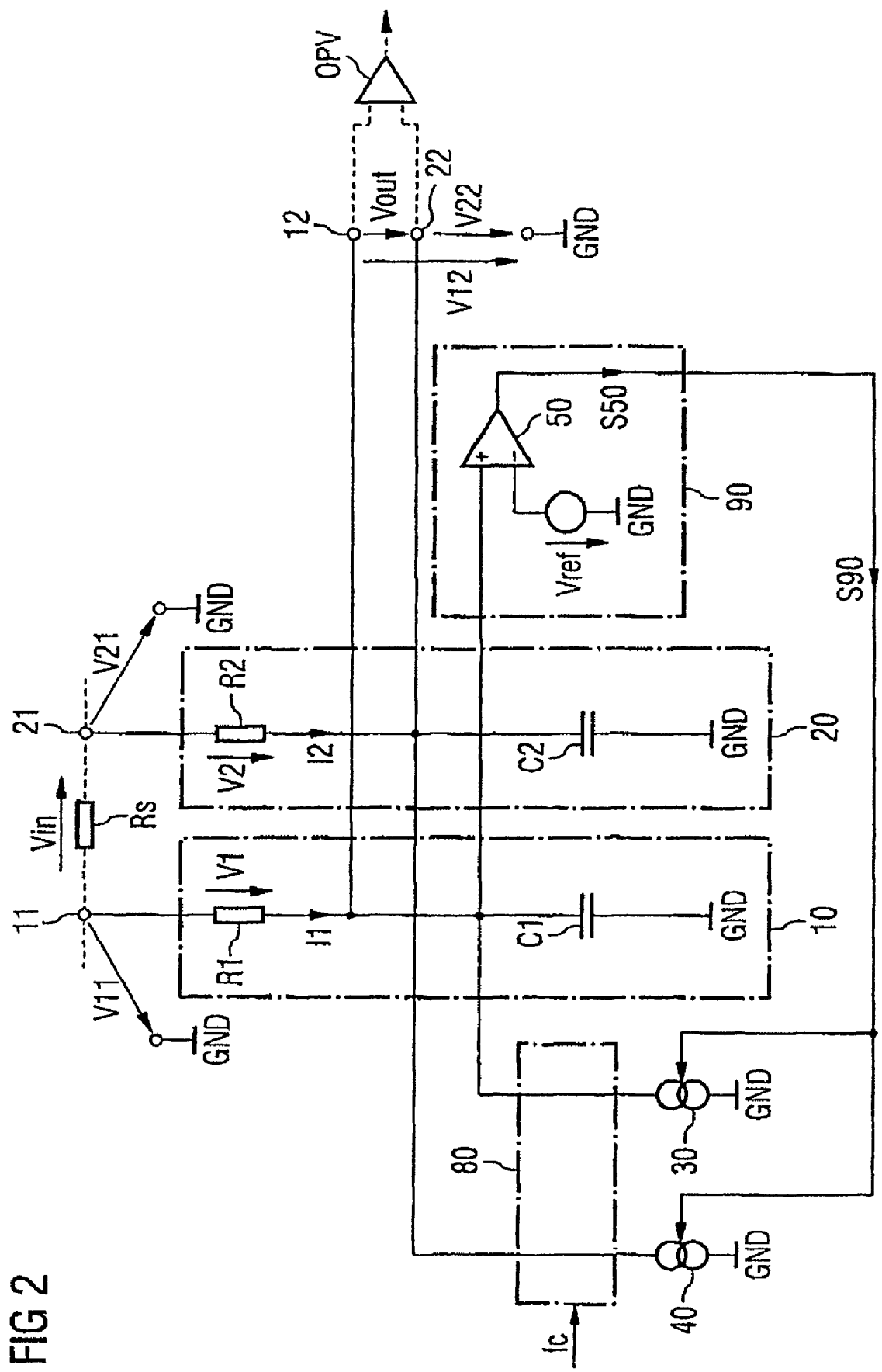
FIG. 2 illustrates a first exemplary embodiment of a level converter a according to the invention.

The level converter illustrated in FIG. 2 has first and second input terminals 11, 21 for applying a first voltage Vin as input voltage. This voltage is intended to be converted to a second voltage Vout (which has the same magnitude) as output voltage. Referring to the statements made in relation to FIG. 1, the input voltage Vin is, for example, a voltage across a current measuring resistor Rs which is connected between the input terminals 11, 21.

In addition, the level converter has a first RC element 10 having an input, which is connected to the first input terminal 11, and an output, which is connected to a first output terminal 12, as well as a second RC element having an input, which is connected to the second input terminal 21, and an output, which is connected to a second output terminal 22. In the example, the two RC elements are first-order RC elements and each includes a non-reactive resistance element R1, R2 and a capacitive component C1, C2. In this embodiment, the resistors R1, R2 are each connected between one of the input terminals 11, 21 and one of the output terminals 12, 22, while the capacitors C1, C2 are each connected between the output terminals 12, 22 and a reference-ground potential GND. The two RC elements are preferably dimensioned identically, that is to say the two resistors R1, R2 have identical resistances and the two capacitors C1, C2 have identical capacitances.

A first controlled current source arrangement 30 is connected to the first output terminal 12, and a second controlled current source arrangement 40 is connected to the second output terminal 22. These two current source arrangements 30, 40 are driven using a common control signal S90 and are used to set the potentials at the output terminals 12, 22, that is to say, in the present case, are used to set the voltages across the capacitors C1, C2, which are connected between the output terminals 12, 22 and reference-ground potential GND, and the voltages across the resistors R1, R2, which are connected between the input terminals 11, 21 and the output terminals 12, 22.

In order to generate the control signal S90, provision is made of a control signal generating circuit 90 which, in the example, has a differential amplifier 50 which compares a potential V12 at the first output terminal 12 with a reference potential Vref in order to generate a differential signal S50. In the exemplary embodiment shown in FIG. 2, this differential signal S50 is used as a control signal S90 for the two controlled current source arrangements 30, 40.

It shall be pointed out that, for the further explanations, "potential" is to be understood below as meaning such a potential at a terminal or a node of the circuit which is based on the reference-ground potential GND of the circuit. In this connection, V12 is used to denote a potential at the first output terminal 12, which potential is based on reference-ground potential GND, and V22 is used to denote a potential at the second output terminal 22, which potential is based on reference-ground potential GND. V11 and V21 denote potentials at the first and second input terminals 11, 21, which potentials are each based on reference-ground potential GND.

V1 and V2 are used below to denote voltages across the resistance elements R1, R2 of the RC elements 10, 20, which voltages are caused by currents I1, I2 flowing through these resistance elements R1, R2.

The method of operation of the level converter shown in FIG. 2 will be explained below. In the example illustrated, the input voltage Vin corresponds to the difference between the input potentials V11, V21. Thus:

$$Vin = V11 - V21 \quad (1)$$

The output voltage Vout at the output terminals 12, 22 is obtained in a corresponding manner from the difference between the output potentials V12, V22, with the result that:

$$Vout = V12 - V22 \quad (2)$$

The first output potential V12 at the first output terminal 12 corresponds to the first input potential V11 at the first input terminal 11 minus the voltage V1 across the first resistance element R1. The second output potential V22 at the second output terminal 22 is obtained in a corresponding manner from the second input potential V21 at the first input terminal 21 minus the voltage V2 across the second resistance element R2. Thus:

$$V12 = V11 - V1 = V11 - I1 \cdot R1 \quad (3a)$$

$$V22 = V21 - V2 = V21 - I2 \cdot R2 \quad (3b)$$

Assuming that the voltages V1, V2 across the resistance elements R1, R2 are identical, it follows, from equations (3a) and (3b), for the output voltage Vout that:

$$Vout = V11 - V21 \quad (4).$$

The magnitude of the output voltage Vout thus corresponds to that of the input voltage Vin with the difference that the output voltage Vout is based on the second output potential V22, while the input voltage Vin is based on the second input potential V21.

In the example, this second output potential V22 is obtained from the difference between the first output potential V12 and the output voltage Vout. The control signal generating circuit 90 and the first current source arrangement 30 are used to set the first output potential V12 in such a manner that the first output potential V12 is in the region of the reference potential Vref. Assuming that the differential amplifier 50 has a large gain factor, it can be assumed that the first output potential V12 is adjusted to the value of the reference potential Vref. This first output potential V12 is regulated using the first current source arrangement 30 which is used to set the current I1 flowing through the resistance element R1 in such a manner that the voltage drop V1 across this resistance element R1 corresponds to the difference between the first input potential V11 and the reference potential Vref.

The two current source arrangements 30, 40 are driven jointly using the control signal S90 and are dimensioned identically. Assuming that the two RC elements are also dimensioned identically, the voltage drop V2 across the second resistance element R2 corresponds to the voltage drop V1 across the first resistance element. Using equations (1) to (4) specified above, it can be shown that, in this case, the following applies to the second output potential V22:

$$V22 = Vref - (V11 - V21) = Vref - Vin = Vref - Vout \quad (5)$$

For the purpose of further explanation, the situation in which the input voltage Vin is subject to a common mode change shall now be considered, in the case of which, although the magnitude of the input voltage Vin remains the same, the input potentials V11, V21 likewise change. If these potentials V11, V21 increase, the output potentials V12, V22 likewise begin to increase, with the currents I1, I2 through the resistance elements R1, R2 initially remaining the same. In response to this, the control signal generating circuit 90 having the differential amplifier 50 is used to drive the current source arrangements 30, 40 in such a manner that the current I1, I2 respectively flowing through the resistance elements R1, R2 is increased in order to thereby adjust the first output potential V12 to the reference potential Vref in the manner explained above. If the input potentials V11, V21 fall, the output potentials V12, V22 begin to fall in common mode fashion, with the result that the control signal generating circuit 90 is used to reduce the current consumptions of the current source arrangements 30, 40 in such a manner that the currents I1, I2 flowing through the resistance elements R1, R2 become smaller in order to adjust the first output potential V12 to the reference value Vref.

On account of the low-pass character of the RC elements, the level converter illustrated has a markedly stable regulating behavior. On account of this low-pass character, rapid common mode changes in the input voltage Vin have only a delayed effect on corresponding common mode changes in the output potentials V12, V22, it being possible to use the control signal generating circuit 90 in conjunction with the current source arrangements 30, 40 to effectively compensate for said common mode changes in the output potentials. If the input voltage Vin is now changed by the second input potential 21 falling, for example, this change has a direct effect on the output voltage Vout on account of the voltage drop V2—which remains constant in the event of such a change—across the second resistance element R2. If the input voltage Vin is changed by the first input potential 11 changing, the first current source arrangement 30 is used to adapt the current through the first resistance element R1 in such a manner that the reference potential Vref is set again as the first output potential V12. The resultant change in the current through the second resistance element R2 gives rise to the adaptation (explained above) of the output voltage Vout to the input voltage Vin.

As immediately emerges from the previous explanations, the output voltage Vout is independent of common mode fluctuations in the input voltage Vin in the level converter according to the invention. In the example shown in FIG. 2, the output voltage Vout is always based on a potential value V22 which is obtained from the reference potential Vref minus the input voltage Vin. If, in the circuit shown in FIG. 2, the second output potential V22 was supplied to the differential amplifier 50 instead of the first output potential V12, the second output potential V22 would thus be kept constant, with the result that the output voltage Vout would always be based on the constant reference potential Vref.

An amplifier OPV which, if appropriate, processes the output voltage Vout further and is illustrated using dashed lines in FIG. 2 must only have, in the case of the level converter according to the invention, an operating range which results from the reference potential Vref used and the expected value of the output voltage Vout.

In the case of the explanations given up to now, it was assumed that the input potentials V11, V21 are greater than the output potentials V12, V22. However, if the current source arrangements 30, 40 and the differential amplifier 50 are suitably chosen, the level converter also operates for input potentials which are smaller than the reference potential Vref. In this case, the currents flow through the resistors R1, R2 counter to the current direction illustrated in FIG. 2, it being necessary, in this case, to suitably select the current source arrangements 30, 40 in order to drive a current through the resistance elements R1, R2 in this direction.

The accuracy of the level converter illustrated in FIG. 2 decisively depends on the RC elements 10, 12 being dimensioned identically and on the two current source arrangements 30, 40 driving identical currents through the resistance elements R1, R2 when driven in an identical manner. On account of production-dictated fluctuations, identical control signals at the two current source arrangements 30, 40 may, under certain circumstances, lead to different currents.

In order to avoid resultant negative effects on the method of operation of the level converter, a so-called "chopper arrangement" 80 is preferably connected between the output terminals 12, 22 and the current source arrangements 30, 40. This chopper arrangement 80 is designed to alternately connect the current source arrangements 30, 40 to the first and second output terminals 12, 22 in time with a clock signal Fc, thus "averaging out" discrepancies between the currents provided by the two current source arrangements.

Figure 3:
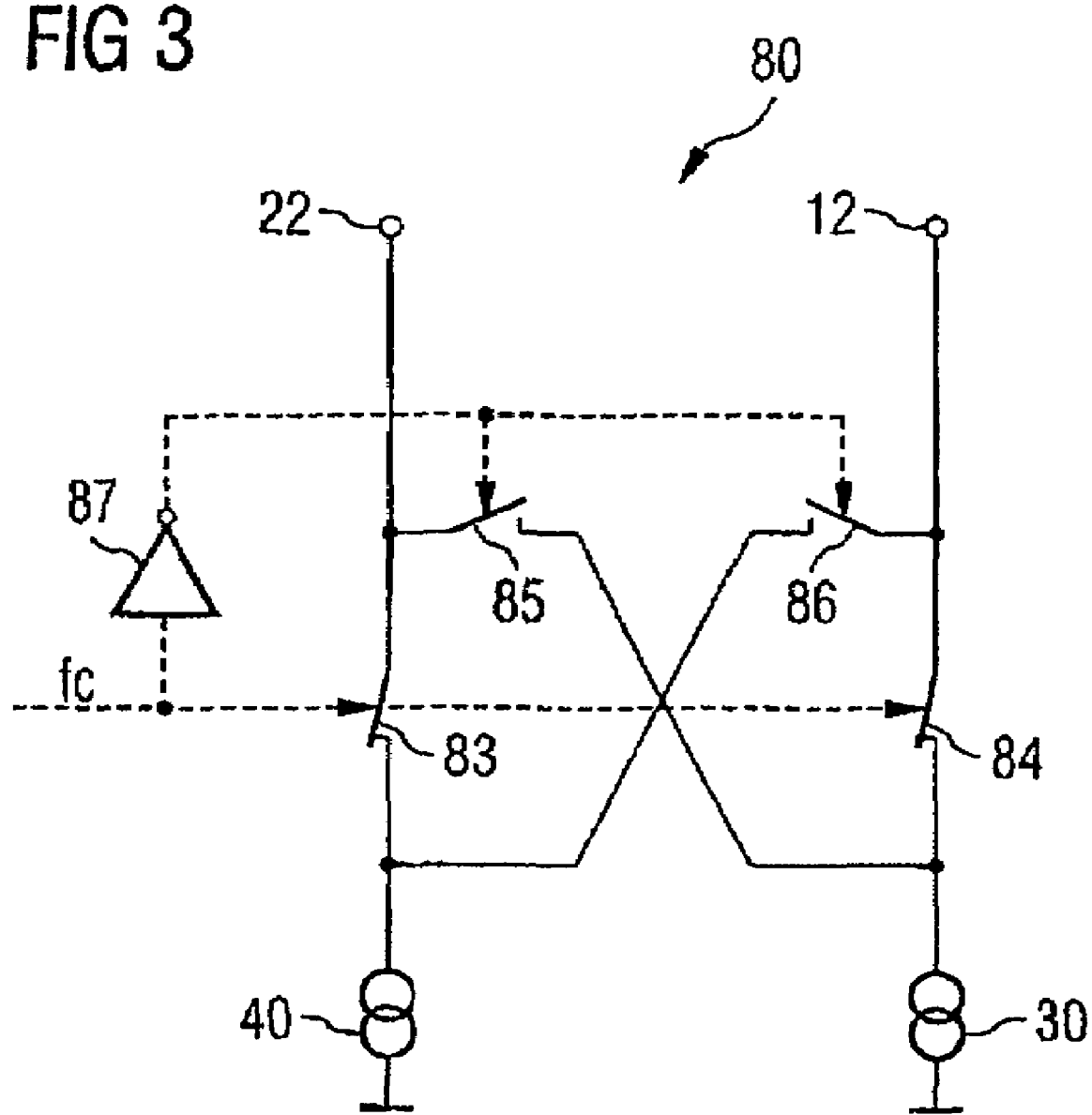
FIG. 3 illustrates an exemplary implementation of a chopper circuit.

FIG. 3 illustrates one possible exemplary implementation of such a chopper arrangement. The chopper arrangement has four switches 83-86, of which the switches 83, 84 are each closed together and the switches 85, 86 are each closed together. In the example, the switches 83, 84 are driven directly using the clock signal Fc, while the two other switches 85, 86 are driven, via an inverter 87, on the basis of the clock signal. When the switches 83, 84 are closed, the first current source arrangement 30 is connected to the first output terminal 12 and the second current source arrangement 40 is connected to the second output terminal 22. When the switches 85, 86 are closed, the first current source arrangement 30 is connected to the second output terminal 22, while the second current source arrangement 40 is connected to the first output terminal 12.

In the case of the exemplary embodiment of the level converter explained above with reference to FIG. 2, the current consumptions of the current source arrangements 30, 40 are adapted with the aim, when the input potentials V11, V21 change, of readjusting the output potentials V12, V22 only when the output potentials V12, V22 begin to change.

Figure 4:
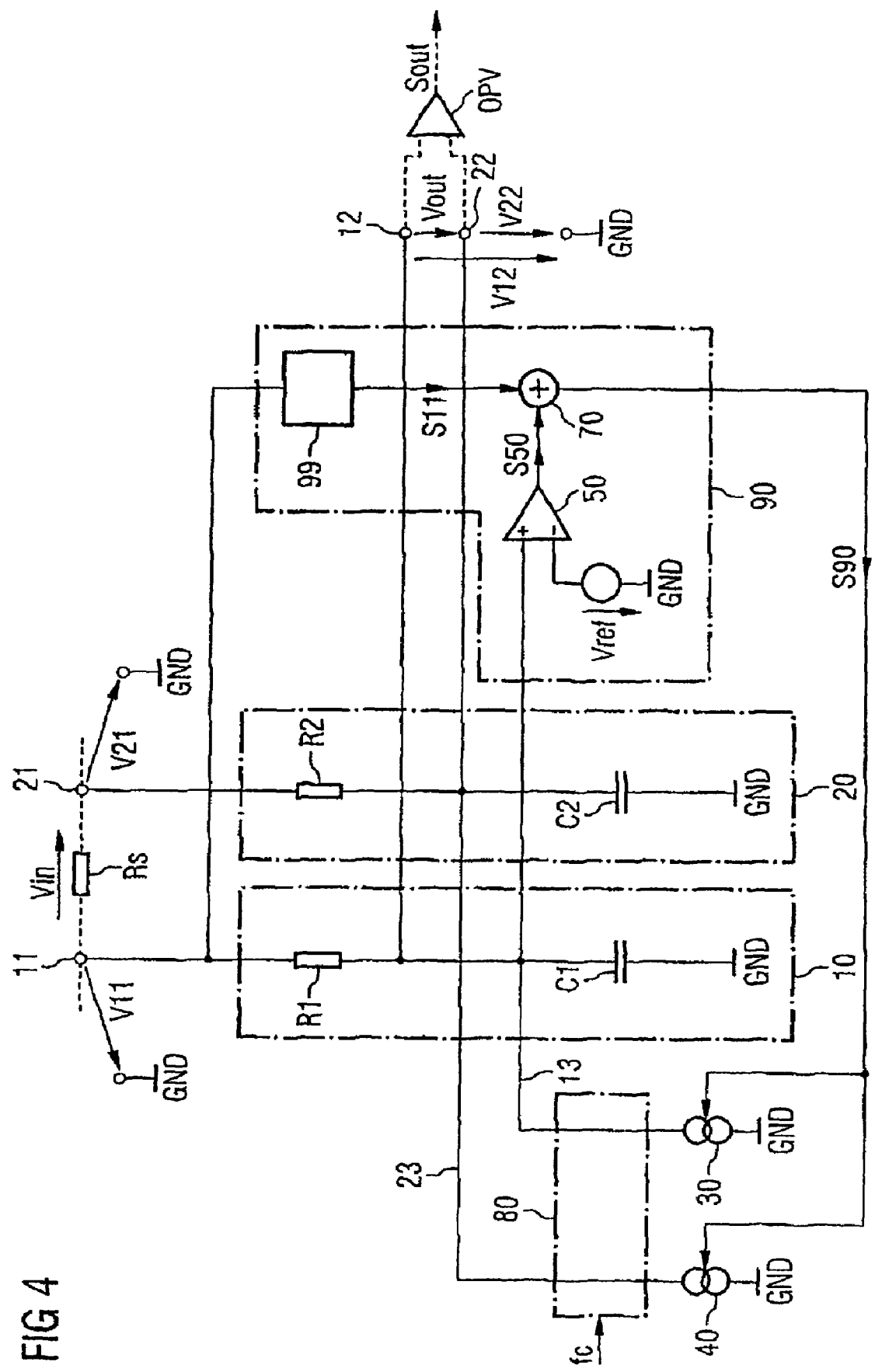
FIG. 4 illustrates a second exemplary embodiment of a level converter according to the invention.

In order to speed up the regulating operation, feed forward is provided in the level converter shown in FIG. 4, as a result of which changes, in particular common mode changes, in the input potentials V11, V21 have a direct effect on the regulation of the current consumption of the current source arrangements 30, 40 and thus on the regulation of the output potentials V12, V22. To this end, the control signal generating circuit 90 is connected to the input terminal 11 and has a signal converter 99 which converts the first input potential V11 at the first input terminal 11 into an input potential signal S11. This input potential signal S11 is supplied, together with the differential signal S50, to a signal combination circuit 70 which is diagrammatically illustrated in FIG. 4 in the form of an adder which adds the input potential signal S11 to the differential signal S50 from the differential amplifier arrangement 50 in order to generate the control signal S90.

If, in the case of this level converter, the input potentials V11, V21 change on account of common mode fluctuations, this change leads directly, via the input potential S11 and the signal combination circuit 70, to a change in the control signal S90 with the aim of adapting the current consumptions of the current source arrangements 30, 40 and of counteracting a change in the first output potential V12 which is adjusted to the value of the reference potential Vref.

In the exemplary embodiments explained above with reference to FIGS. 2 and 4, the differential amplifier arrangement 50 of the control signal generating circuit 90 respectively adjusts the first output potential V12 to the value of the reference potential Vref. In this case, the second output potential V22 remains below this reference potential by the value of the output voltage Vout. If the reference amplifier arrangement is connected to the second output terminal 22 instead of to the first output terminal 12, the second output potential V22 is adjusted to the value of the reference potential Vref, and the first output potential V12 is above this reference potential Vref by the value of the output voltage Vout.

Figure 5:
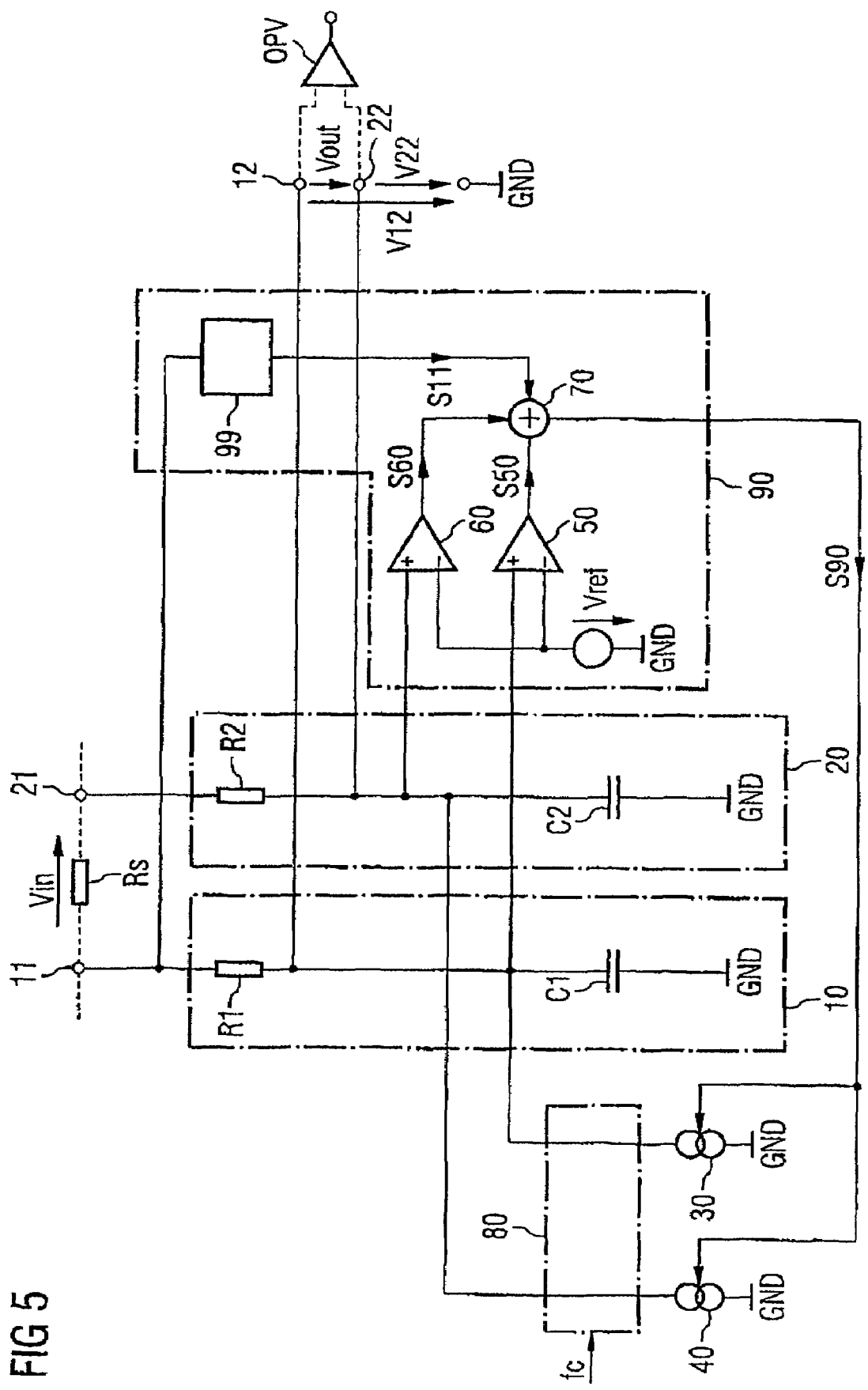
FIG. 5 illustrates a third exemplary embodiment of the level converter according to the invention.

In the exemplary embodiment illustrated in FIG. 5, provision is now made of two differential amplifier arrangements 50, 60, a first differential amplifier arrangement 50 of which compares the first output potential V12 with the reference potential Vref in order to generate a first differential signal S50, and a second differential amplifier arrangement 60 of which compares the second output potential V22 with the reference potential Vref in order to generate a second differential signal S60. The signal combination circuit 70 combines these two differential signals S50, S60 with one another in order to generate the control signal S90. In this exemplary embodiment, the two differential amplifiers 50, 60 operate "against one another" with the respective aim of adjusting the respective output potential to the value of the reference potential Vref. Assuming that the two differential amplifiers 50, 60 are dimensioned identically, the output potentials in this exemplary embodiment are set in such a manner that the first output potential V12 is above the reference potential Vref by half of the output voltage Vout, while the second output potential V22 is below the reference potential Vref by half of the output voltage Vout. Thus:

$$V12 = Vref + 0.5 \cdot Vout \tag{6a}$$

$$V22 = Vref - 0.5 \cdot Vout \tag{6b}.$$

In this exemplary embodiment of the level converter, in which the output potentials V12, V22 are symmetrical around the reference potential Vref, output voltages Vout having an increased dynamic fluctuation range may be processed when a downstream amplifier OPV having a prescribed operating range is used.

Figure 6:
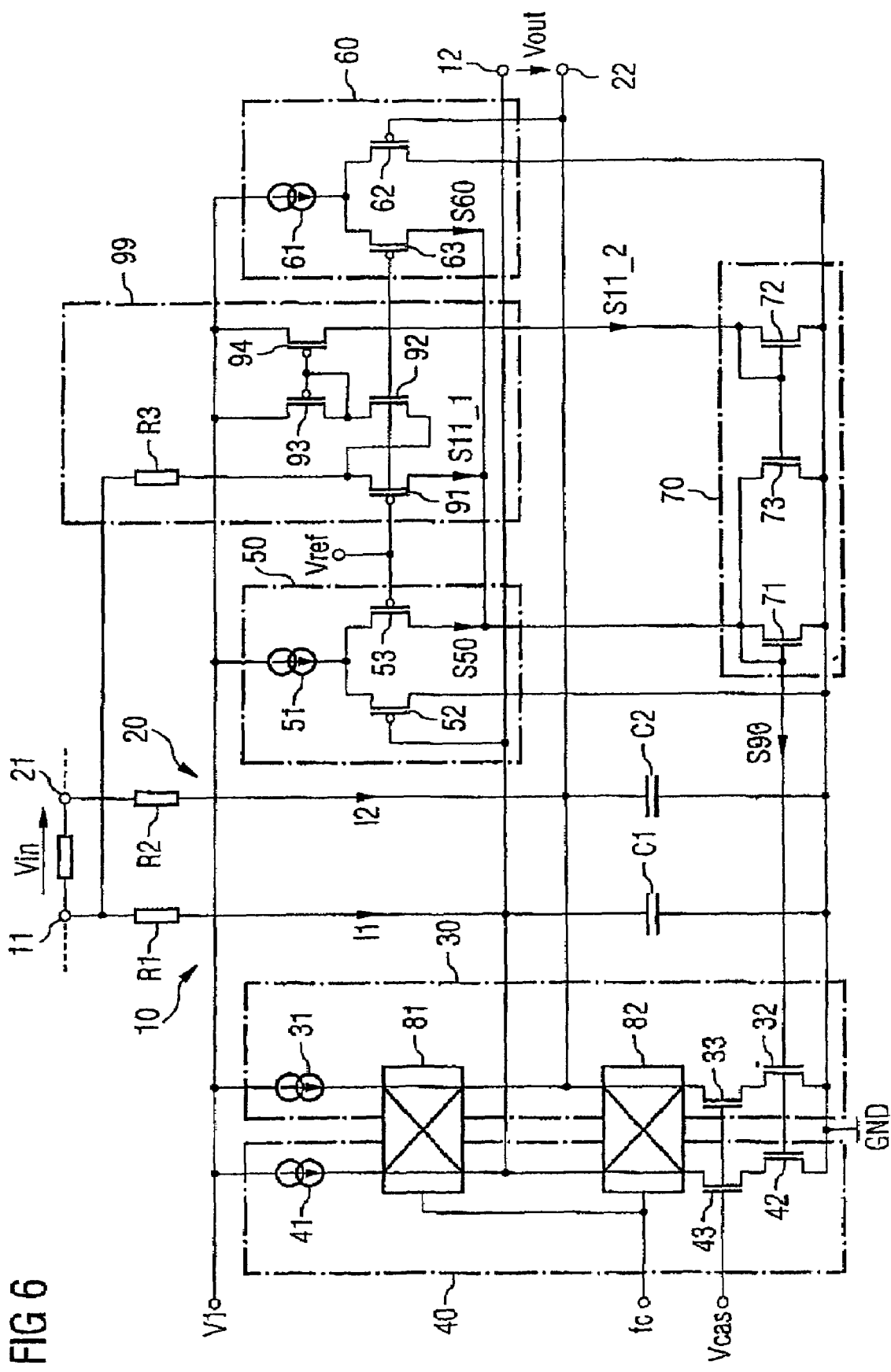
FIG. 6 illustrates exemplary circuitry implementations of some of the components of the level converter shown in FIG. 5.

Exemplary circuitry implementations of the current source arrangements 30, 40 and the control signal generating circuit 90 for the level converter shown in FIG. 5 are explained below with reference to FIG. 6.

The current source arrangements 30, 40 each comprise constant current sources 31, 41 which are connected in series with transistors 32, 42 between an auxiliary potential V1, which is greater than reference-ground potential, and reference-ground potential GND. In the example, the transistors 32, 42 are in the form of n-channel transistors (n-channel MOSFETs) and are jointly driven using the control signal S90. Cascode transistors 33, 43 which are driven using a bias voltage or cascode voltage Vcas are respectively connected, in the current source arrangements 30, 40, between the constant current sources 31, 41 and the control transistors 32, 42. The task of these cascode transistors 33, 43 is, in a sufficiently known manner, to limit the voltage drop across the load paths (drain/source paths) of the control transistors 32, 42. Outputs of the current source arrangements 30, 40 are formed by circuit nodes which are located between the constant current sources 31, 41 and the control transistors 32, 42 and the cascode transistors 33, 43. The current source arrangements 30, 40 illustrated are capable of drawing a current from the RC elements 10, 20. In this case, the control signal S90 is used to turn on the control transistors 32, 42 to such an extent that the current flowing through the control transistors 32, 42 is respectively greater than the current I31, I41 provided by the constant current sources 31, 41. In addition, the current source arrangements 30, 40 may also provide the RC elements 10, 20 with current. In this case, the control transistors 32, 42 are inhibited, with the result that at least some of the current I31, I41 provided by the constant current sources 31, 42 flows into the RC elements 10, 20.

Two chopper arrangements 81, 82 are preferably provided in these current source arrangements 30, 40, one of which is connected between the constant current sources 31, 41 and the outputs of the current source arrangements, while the other is connected between the outputs and the control transistors 32, 42. These chopper arrangements are designed in a manner corresponding to the chopper arrangement shown in FIG. 3. The chopper arrangement 81 connected between the current sources 31, 41 and the outputs is used, in the level converter shown in FIG. 6, to compensate for any possible differences between the constant currents I31, I41 provided by these current sources 31, 41.

In the example, the differential amplifier arrangements 50, 60 of the control signal generating circuit 90 are of identical design. The differential amplifiers 50, 60 each comprise a first transistor 52, 62 and a second transistor 53, 63.

In the example, these transistors are in the form of p-channel transistors. The control connection (gate connection) of the first transistor 52 of the first differential amplifier 50 is connected to the first output terminal 12, while the control connection of the first transistor 62 of the second differential amplifier 60 is connected to the second output terminal 22. The control connections of the second transistors 53, 63 of the two differential amplifiers 50, 60 are each connected to the reference potential Vref. First load connections (the source connections in the example) of the first and second transistors are respectively connected to one another and are connected to a first current source 51 in the first differential amplifier 50 and to a second current source 61 in the second differential amplifier 60. These current sources 51, 61 provide the bias currents for the differential amplifiers 50, 60 and are connected to the auxiliary potential V1.

In the example, the outputs of the two differential amplifiers 50, 60 are formed by the drain connections of the second transistors 53, 63, at which the output signals S50, S60 are respectively available in the form of output currents. These output currents are respectively dependent on the ratio between the reference potential Vref and the output potential V12 or V22 supplied to the respective reference amplifier. These output currents S50, S60 are led to a common circuit node, as a result of which these output currents are added. The summation current is supplied to a transistor 71 of the signal combination circuit 70, said transistor being connected as a diode and converting the summation current signal into the control signal S90 in the form of a voltage signal.

In the example, the signal converter 99 for converting the input potential V11 into the input potential generates two input potential signals S11_1, S11_2, one of which is always zero depending on whether the input potential V11 is greater or less than the reference voltage Vref. The signal converter 99 has a first comparison transistor 91 which is in the form of a p-channel transistor and whose control connection is supplied with the reference potential Vref. The source connection of this transistor 91 is connected to the first input terminal 11 via a series resistor R3. If the input potential 11 is greater than the reference voltage Vref, this comparison transistor 91 provides a current signal as first input potential signal S11_1 which is led to the same node as the output currents S50, S60 of the differential amplifiers 50, 60. In this case, the output current S11_1 of this comparison transistor 91 is larger, the greater the difference between the input potential 11 and the reference potential Vref.

The signal converter also has a second comparison transistor 92 which is in the form of an n-channel transistor and whose control connection is supplied with the reference potential Vref. The source connection of this transistor 92 is likewise connected to the input terminal 11 via the series resistor R3. A current flows through this transistor 92 if the input potential 11 falls below the value of the reference potential Vref. A current mirror 93, 94 which is connected between the auxiliary potential V1 and this second comparison transistor 92 is used to convert this current to a current which flows toward reference-ground potential GND and forms the second input potential signal S11_2. This second input potential S11_2 uses an n-channel transistor 72, which is connected as a diode and is used as a current/voltage converter, to drive a further transistor 73 of the signal combination circuit 70, the load path of said further transistor being connected to the output of the signal combination circuit 70 and thus to the control connections of the control transistors 32, 42 of the current source arrangements 30, 40. If this transistor 73 is driven using the input potential signal S11_2, the amplitude of the drive signal S90 is reduced, thus inhibiting the control transistors 32, 42 of the current source arrangements 30, 40. The more these control transistors 32, 42 are inhibited in this case, the greater the current which flows from the current source arrangements 30, 40 to the RC elements in order to thereby keep the connecting terminals 12, 22 at the values given by the output voltage Vout and the reference potential Vref even if the input potentials 11, 21 are smaller than the reference potential Vref.

If the input potentials 11, 21 are greater than the reference potential Vref, the transistor 73 of the signal combination circuit 70 is turned off and the first input potential signal S11_1 contributes to generating the drive signal S90, the first input potential signal S11_1 being used to set the amplitude of this drive signal S90 in such a manner that the greater the difference between the reference potential Vref and the input potential V11, the larger the amplitude of this signal.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A level converter comprising:
   a first and second input, and a first and second output;
   a first RC element coupled to the first input and coupled to the first output;
   a second RC element coupled to the second input and coupled to the second output;
   a first controlled current source arrangement and a second controlled current source arrangement, each coupled to one of the first and second output; and
   a control signal generating circuit that generates a control signal for the first and second controlled current source arrangements, and including at least one differential amplifier arrangement designed to compare a potential at one of the outputs with a reference potential, and to generate a differential signal on which the control signal is dependent.

2. The level converter of claim 1, the control signal generating circuit comprising:
   a first differential amplifier arrangement configured to compare a potential at the first output with the reference potential and to generate a first differential signal;
   a second differential amplifier arrangement configured to compare a potential at the second output with the reference potential and to generate a second differential signal; and
   a signal combination circuit which is supplied with the first and second differential signals and provides the control signal.

3. The level converter of claim 2, comprising wherein the signal combination circuit additively combines the differential signals with one another.

4. The level converter of claim 1, comprising wherein the control signal generating circuit is coupled to one of the input terminals and generates at least one input potential signal dependent on the potential at the input terminal, and in which the control circuit generates the control signal on the basis of this input potential signal and the at least one differential signal.

5. The level converter of claim 1, comprising wherein at least one chopper arrangement is coupled between the current source arrangements and the outputs and is designed to respectively alternately couple the current source arrangements to the first and second output terminals in time with a chopper signal.

6. The level converter of claim 1, comprising wherein with each of the RC elements comprising:
   a resistance element which is connected between the respective input and the respective output; and
   a capacitive component which is connected between the respective output and a reference-ground potential.

7. The level converter of claim 1, wherein the level converter is configured for converting a voltage across a current measuring resistor connected between the first and second input terminals.

8. A level converter comprising:
  first and second input terminals for applying a first voltage and first and second output terminals for providing a second voltage;
  a first RC element having an input, which is connected to the first input terminal, and having an output, which is connected to the first output terminal; and
  a second RC element having an input, which is connected to the second input terminal, and having an output, which is connected to the second output terminal;
  a first controlled current source arrangement and a second controlled current source arrangement, one of which is respectively connected to one of the first and second output terminals; and
  a control signal generating circuit which generates a control signal for the first and second current source arrangements and has at least one differential amplifier arrangement which is designed to compare a potential at least one of the outputs with a reference potential and to generate a differential signal on which the control signal is dependent.

9. The level convener of claim 8, the control signal generating circuit comprising:
  a first differential amplifier arrangement which is designed to compare a potential at the first output with the reference potential and to generate a first differential signal;
  a second differential amplifier arrangement which is designed to compare a potential at the second output with the reference potential and to generate a second differential signal; and
  a signal combination circuit which is supplied with the first and second differential signals and provides the control signal.

10. The level convener of claim 9, comprising wherein the signal combination circuit additively combines the differential signals with one another.

11. The level convener of claim 8, comprising wherein the control signal generating circuit is connected to one of the input terminals and generates at least one input potential signal which is dependent on the potential at this input terminal, and in which the control signal generating circuit generates the control signal on the basis of this input potential signal and the at least one differential signal.

12. The level convener of claim 8, comprising wherein at least one chopper arrangement is connected between the current source arrangements and the outputs and is designed to respectively alternately connect the current source arrangements to the first and second output terminals in time with a chopper signal.

13. The level convener of claim 8, each of the RC elements comprising:
  a resistance element which is connected between the respective input terminal and the respective output terminal; and
  a capacitive component which is connected between the respective output terminal and a reference-ground potential.

14. The level converter of claim 8, comprising wherein the level converter is configured for converting a voltage across a current measuring resistor connected between the first and input terminals.

15. A level converter comprising:
  first and second input terminals for applying a first voltage and first and second output terminals for providing a second voltage;
  a first RC element having an input, which is connected to the first input terminal, and having an output, which is connected to the first output terminal; and
  a second RC element having an input, which is connected to the second input terminal, and having an output, which is connected to the second output terminal;
  a first controlled current source arrangement and a second controlled current source arrangement, one of which is respectively connected to one of the first and second output terminals;
  a control signal generating circuit which generates a control signal for the first and second current source arrangements and has at least one differential amplifier arrangement which is designed to compare a potential at least one of the outputs with a reference potential and to generate a differential signal on which the control signal is dependent; and
  the control circuit is connected to one of the input terminals and generates at least one input potential signal which is dependent on the potential at this input terminal, and in which the control circuit generates the control signal on the basis of this input potential signal and the at least one differential signal.

16. The level converter as claimed in claim 15, with the control signal generating circuit comprising:
  a first differential amplifier arrangement which is designed to compare a potential at the first output with the reference potential and to generate a first differential signal;
  a second differential amplifier arrangement which is designed to compare a potential at the second output with the reference potential and to generate a second differential signal;
  a signal combination circuit which is supplied with the first and second differential signals and provides the control signal.

17. The level converter of claim 16, in which the signal combination circuit additively combines the differential signals with one another.

18. The level converter of claim 17, comprising wherein at least one chopper arrangement is connected between the current source arrangements and the outputs and is designed to respectively alternately connect the current source arrangements to the first and second output terminals in time with a chopper signal.

19. The level converter of claim 18, each of the RC elements comprising:
  a resistance element which is connected between the respective input terminal and the respective output terminal; and
  a capacitive component which is connected between the respective output terminal and a reference-ground potential.

20. The level converter of claim 19, comprising wherein the level converter is configured for converting a voltage across a current measuring resistor.

21. A level converter comprising:

first and second input for applying a first voltage and first and second output for providing a second voltage;

means for providing a first RC element having an input, which is connected to the first input, and having an output, which is connected to the first output; and means for providing a second RC element having an input, which is connected to the second input, and having an output, which is connected to the second output;

a first controlled current source arrangement and a second controlled current source arrangement, one of which is respectively connected to one of the first and second output; and means for providing a control signal generating circuit that generates a control signal for the first and second current source arrangements and has at least one differential amplifier arrangement which is designed to compare a potential at least one of the outputs with a reference potential and to generate a differential signal on which the control signal is dependent.

* * * * *